(12) United States Patent
Eom et al.

(10) Patent No.: US 9,648,766 B1
(45) Date of Patent: May 9, 2017

(54) JUNCTION BOX

(71) Applicant: YOUNG HWA TECH CO., LTD, Chungcheongnam-do (KR)

(72) Inventors: Jun Hyong Eom, Chungcheongnam-do (KR); Myoung Sung Baek, Chungcheongnam-do (KR)

(73) Assignee: YOUNG HWA TECH CO., LTD, Chungcheongnam-do (KR)

( * ) Notice: Subject to any disclaimer, the term of this patent is extended or adjusted under 35 U.S.C. 154(b) by 0 days.

(21) Appl. No.: 15/013,315

(22) Filed: Feb. 2, 2016

(30) Foreign Application Priority Data

Dec. 8, 2015 (KR) .................. 10-2015-0173815

(51) Int. Cl.
*H05K 5/02* (2006.01)

(52) U.S. Cl.
CPC ......... *H05K 5/0217* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 1,875,101 A * | 8/1932 | Morrell | ......... | H02G 3/123 174/57 |
| 5,785,409 A * | 7/1998 | Reinert, Sr. | ......... | B64F 1/20 174/57 |
| 5,950,852 A * | 9/1999 | Hudspeth | ......... | H02G 3/185 174/66 |
| 5,975,323 A * | 11/1999 | Turan | ......... | H02G 3/086 220/3.7 |
| 6,820,760 B2 * | 11/2004 | Wegner | ......... | H02G 3/086 174/57 |
| 7,301,099 B1 * | 11/2007 | Korcz | ......... | H02G 3/14 174/135 |
| 7,531,743 B2 * | 5/2009 | Johnson | ......... | H02G 3/081 174/53 |
| 7,700,875 B2 * | 4/2010 | Lalancette | ......... | H02G 3/086 174/481 |
| 8,253,017 B1 * | 8/2012 | Cleghorn | ......... | H02G 3/086 174/50 |
| 8,987,593 B2 * | 3/2015 | Korcz | ......... | H02G 3/123 174/58 |

FOREIGN PATENT DOCUMENTS

| | | |
|---|---|---|
| JP | 3340991 | 11/2002 |
| KR | 1020070051211 | 5/2007 |
| KR | 100796715 | 1/2008 |
| KR | 200473133 | 6/2014 |

* cited by examiner

*Primary Examiner* — Xanthia C Cunningham
(74) *Attorney, Agent, or Firm* — I P & T GROUP LLP

(57) ABSTRACT

A junction box includes a main body in which circuit components are installed, a lower cover configured to cover a lower portion of the main body, one or more sockets installed on a lower surface of the main body, one or more connectors installed in the lower cover and configured to be coupled to the sockets, a single coupling bolt installed in the main body, and a single coupling nut installed in the lower cover and threadedly coupled to the coupling bolt. When rotationally operating the single coupling bolt, the main body is configured to move up or down with respect to the lower cover so that the sockets are coupled to or decoupled from the connectors while making up/down movement with respect to the connectors.

11 Claims, 11 Drawing Sheets

JUNCTION BOX

CROSS-REFERENCE TO RELATED APPLICATION

The present application claims priority to Korean patent application number 10-2015-0173815, filed on Dec. 8, 2015, the entire disclosure of which is herein incorporated by reference in its entirety.

TECHNICAL FIELD

The present invention relates to a junction box and, more particularly, to a junction box capable of improving the coupling/decoupling structure of a connector and a socket, enabling the connector and the socket to be coupled and decoupled with ease, reducing the manufacturing cost of the junction box, making it easy to form an electric circuit, making it possible to reduce the size of the junction box, and enabling the junction box to be installed in a narrow space.

BACKGROUND ART

A junction box is used to concentrate electric circuit components such as a fuse, a relay or the like in a motor vehicle. The junction box includes a plurality of electric circuits connected to respective electric devices of a motor vehicle.

As illustrated in FIGS. 1 to 3, the junction box includes a main body 10 to which a plurality of circuit components E are mounted, an upper cover 20 which covers the upper portion of the main body 10, a lower cover 30 which covers the lower portion of the main body 10, a plurality of sockets 12 which are installed on the lower surface of the main body 10 so as to be connected to the circuit components E, and a plurality of connectors 32 which are installed in the lower cover 30 so as to be coupled to the sockets 12.

The junction box further includes a plurality of coupling bolts 40 installed in the main body 10 and a plurality of coupling nuts 42 installed in the respective connectors 32 so as to be threadedly coupled to the coupling bolts 40.

The coupling bolts 40 are installed in the main body 10 so as to protrude toward the respective connectors 32 of the lower cover 30. The coupling bolts 40 thus installed are threadedly coupled to the coupling nuts 42 of the connectors 32.

If the coupling bolts 40 threadedly coupled to the coupling nuts 42 are rotated in a forward direction by a worker, the coupling nuts 42 are moved upward along the coupling bolts 40 while making screw motion. The coupling nuts 42 cause the connectors 32 to move upward. This enables the respective connectors 32 of the lower cover 30 to be coupled to the corresponding sockets 12 existing above the connectors 32.

On the other hand, if the coupling bolts 40 are rotated in a reverse direction, the coupling nuts 42 are moved downward along the coupling bolts 40 while making screw motion. The coupling nuts 42 cause the connectors 32 to move downward. This enables the respective connectors 32 to be decoupled from the corresponding sockets 12 existing above the connectors 32.

Consequently, the coupling bolts 40 and the coupling nuts 42 cause the connectors 32 of the lower cover 30 to move upward or downward in response to the worker's operation, thereby coupling or decoupling the connectors 32 and the sockets 12.

However, in the conventional junction box described above, the bolting units of the coupling bolts 40 and the coupling nuts 42 for coupling and decoupling the connectors 32 and the sockets 12 are installed in each and every connector 32. Thus, the junction box becomes structurally complicated and requires a large number of components. This leads to an increase in the manufacturing cost.

Since the bolting units of the coupling bolts 40 and the coupling nuts 42 are installed in each and every connector 32, the respective coupling bolts 40 should be individually operated one by one in order to couple and decouple the respective connectors 32 and the respective sockets 12. Thus, the coupling and decoupling works of the connectors 32 and the sockets 12 is very onerous and time-consuming.

Furthermore, since the bolting units of the coupling bolts 40 and the coupling nuts 42 are installed in each and every connector 32, different installation spaces for accommodating the bolting units of the coupling bolts 40 and the coupling nuts 42 need to be provided in the connectors 32 and the main body 10. This leads to a loss of spaces.

Particularly, in the case of the main body 10 and the connectors 32, the spaces for installation of electric circuits become narrow due to the existence of the bolting units of the coupling bolts 40 and the coupling nuts 42. This may impose many restrictions on the configuration of electric circuits.

Moreover, in the conventional junction box, when moving the connectors 32 upward and downward by the bolting units, variations occur in the upward/downward movement amounts of the respective connectors 32.

Particularly, the portions of the connectors 32 existing far away from the bolting units is smaller in the upward/downward movement amounts than the portion of the connectors 32 existing close to the bolting units. Due to these variations in the upward/downward movement amounts, the coupling accuracy of the connectors 32 to the sockets 12 is sharply reduced. For that reason, the connectors 32 may not be coupled to the sockets 12 or may be inaccurately coupled to the sockets 12.

In addition, the conventional structure has a structure in which the connectors 32 are coupled to and decoupled from the sockets 12 while making up/down movement. Therefore, the length of wire harnesses 32a connected to the connectors 32 needs to be designed and set in view of the up/down movement stroke of the connectors 32.

Since the length of wire harnesses 32a is designed and set in view of the up/down movement stroke of the connectors 32, the manufacturing cost increased.

In view of the foregoing, there have been developed many different techniques capable of making it easy to couple and decouple the connectors 32 and the sockets 12, reducing the loss of spaces, and increasing the installations spaces for terminals and circuit components.

Examples of these techniques include a junction box disclosed in Korean Patent Application No. 2006-112772. In this junction box, as illustrated in FIG. 4, connectors 32 and sockets 12 are coupled and decoupled using a lever 50. The junction box includes a lever 50 installed in an upper cover 20 in a foldable manner, a pair of sliders 52 installed in a main body 10 so as to horizontally move in conjunction with the unfolding operation of the lever 50, and a combination of guide slots 54 of the sliders 52 and guide projections 56 of a lower cover 30 configured to convert the horizontal movement of the sliders 52 to the up/down movement thereof.

The guide slots 54 and the guide projections 56 are combined so as to make frictional contact with each other.

The guide slots 54 and the guide projections 56 are configured to convert the horizontal movement of the sliders 52 to the up/down movement thereof.

Accordingly, when folding and unfolding the lever 50, the main body 10 provided with the sliders 52 are moved up and down. Thus, the sockets 12 of the main body 10 are moved up and down and are coupled to and decoupled from the connectors 32 existing below the sockets 12.

The conventional junction box having the aforementioned configuration is easy to use, because the sockets 12 of the main body 10 and the connectors 32 of the lower cover 30 can be automatically coupled and decoupled by merely folding and unfolding the lever 50.

While the conventional junction box has a merit in that it is easy to couple and decouple the sockets 12 and connectors 32 and it is advantageous to form electric circuits, the structures of the lever 50 and the sliders 52 for moving the main body 10 up and down are very complex. This leads to an increase in the manufacturing cost.

Furthermore, there is a need to additionally provide installation spaces for the installation of the lever 50 and the sliders 52. Thus, the overall size of the junction box is necessarily increased.

For that reason, the junction box occupies a large space when installing the junction box in a motor vehicle. As a result, it is not possible to cope with the trend of size reduction and slimming of the junction box required for the reduction of an internal space of a motor vehicle.

Furthermore, the conventional junction box has a structure in which the sockets 12 and the connectors 32 are coupled and decoupled by folding and unfolding the lever 50. Thus, it is necessary to secure a space for folding and unfolding the lever 50. For that reason, the junction box cannot be installed in a motor vehicle having a narrow installation space.

Moreover, during the course of folding and unfolding the lever 50, a heavy load is applied to between the lever 50 and the sliders 52 and between the sockets 12 and the connectors 32. Thus, it is highly likely that the lever 50, the sliders 52, the sockets 12 and the connectors 32 are damaged or broken.

In view of this, the frictional contact portions between the lever 50 and the sliders 52 and the frictional contact portions between the sockets 12 and the connectors 32 may be made of a high-strength material such as, for example, steel or a composite material. In this case, however, there is a possibility that a short circuit is generated and a cost is increased.

In addition, the conventional junction box has a structure in which the sockets 12 and the connectors 32 are coupled and decoupled through the rotation of the lever 50, the horizontal movement of the sliders 52 and the frictional contact of the guide slots 54 and the guide projections 56. Thus, the frictional contact portions between the lever 50 and the sliders 52 and the frictional contact portions between the sockets 12 and the connectors 32 are worn.

As a result, the assembly accuracy of components is reduced and the dimensional error is generated. For that reason, the main body 10 is not smoothly moved up and down and the coupling accuracy of the connectors 32 and the sockets 12 is reduced. Thus, the connectors 32 may not be coupled to the sockets 12 or may be inaccurately coupled to the sockets 12.

SUMMARY OF THE INVENTION

In view of the aforementioned problems inherent in the prior art, it is an object of the present invention to provide a junction box capable of enabling connectors and sockets to be coupled and decoupled through the use of a simple structure, reducing the number of components and consequently reducing the manufacturing cost.

Another object of the present invention is to provide a junction box capable of enabling connectors and sockets to be coupled and decoupled at one time and making it easy and convenient to couple and decouple the connectors and the sockets.

Another object of the present invention is to provide a junction box capable of enabling connectors and sockets to be rapidly coupled and decoupled within a short period of time and increasing the work efficiency.

Another object of the present invention is to provide a junction box capable of simplifying a coupling/decoupling structure of connectors and sockets, reducing an installation space of the coupling/decoupling structure, and reducing a space loss.

Another object of the present invention is to provide a junction box capable of increasing an installation space of terminals and circuit components, and enabling an electric circuit to be readily formed.

Another object of the present invention is to provide a junction box capable of realizing size reduction and slimming and capable of being installed in a narrow space.

Another object of the present invention is to provide a junction box capable of enabling connectors and sockets to be coupled and decoupled through a bolting unit, enabling the connecters and the sockets to be coupled and decoupled within a narrow space, and enjoying superior maintainability.

Another object of the present invention is to provide a junction box capable of enabling sockets of a main body to be coupled to and decoupled from connectors of a lower cover through the accurate movement of the sockets.

Another object of the present invention is to provide a junction box capable of improving the coupling accuracy of sockets and connectors, and preventing inaccurate coupling of the sockets and the connectors.

Another object of the present invention is to provide a junction box capable of enabling connectors and sockets to be coupled and decoupled with no severe frictional contact between components.

Another object of the present invention is to provide a junction box capable of reducing wear of components attributable to frictional contact between components and preventing reduction of assembly accuracy of components.

Another object of the present invention is to provide a junction box capable of preventing reduction of a coupling ability of connectors and sockets.

Another object of the present invention is to provide a junction box capable of enabling sockets to be coupled to and decoupled from connectors while making up/down movement, and eliminating a need to adjust the length of wire harnesses of connectors.

Another object of the present invention is to provide a junction box capable of shortening the length of wire harnesses and consequently saving a cost.

In order to achieve the above objects, there is provided a junction box, including: a main body in which circuit components are installed; a lower cover configured to cover a lower portion of the main body; one or more sockets installed on a lower surface of the main body; one or more connectors installed in the lower cover and configured to be coupled to the sockets; a single coupling bolt installed in the main body; and a single coupling nut installed in the lower cover and threadedly coupled to the coupling bolt, wherein when rotationally operating the single coupling bolt, the main body is configured to move up or down with respect to the lower cover so that the sockets are coupled to or decoupled from the connectors while making up/down movement with respect to the connectors.

The junction box may further include: a fixing unit configured to fix the connectors to the lower cover, the fixing unit including connector installation groove portions installed inside the lower cover so as to accommodate the connectors and connector fixing hooks installed in pairs in opposite sidewalls of the connector installation groove portions so as to lock and fix the connectors installed in the connector installation groove portions.

When tightening or loosening the coupling bolt, the coupling nut may be configured to cause the coupling bolt to move up or down so that the sockets are moved toward or away from the connectors.

When rotating the coupling bolt in a forward direction, the main body may be configured to move down toward the lower cover so that the main body and the lower cover are assembled with each other and so that the sockets and the connectors are coupled to each other, and when rotating the coupling bolt in a reverse direction, the main body may be configured to move up away from the lower cover so that the main body and the lower cover are disassembled from each other and so that the sockets and the connecters are decoupled from each other.

The junction box may further include: a provisional assembling unit configured to provisionally assemble the lower cover with the main body prior to tightening the coupling bolt, the provisional assembling unit including a plurality of provisional assembling brackets having provisional assembling slots and extending from the lower cover toward the main body and a plurality of provisional assembling projections formed in the main body and configured to be fitted to the provisional assembling slots of the provisional assembling brackets, wherein the lower cover is configured to be provisionally assembled with the main body when the provisional assembling projections are fitted to the provisional assembling slots of the provisional assembling brackets, and the provisional assembling slots of the provisional assembling brackets are formed so as to allow up/down movement of the main body with respect to the lower cover when the coupling bolt is tightened or loosened.

The junction box may further include: a guide unit configured to guide up/down movement of the main body with respect to the lower cover, the guide unit including a plurality of guide rods extending from the main body toward the lower cover and a plurality of guide pipes configured to accommodate the guide rods and installed in the lower cover so as to guide up/down movement of the guide rods.

According to the junction box of the present invention, it is possible to enable connectors and sockets to be coupled and decoupled through the use of a single bolting unit, reduce the number of components and consequently reduce the manufacturing cost.

Furthermore, it is possible for the present junction box to enable connectors and sockets to be coupled and decoupled at one time through a simple operation and make it easy and convenient to couple and decouple the connectors and the sockets.

Furthermore, it is possible for the present junction box to enable connectors and sockets to be rapidly coupled and decoupled within a short period of time and increase the work efficiency.

Furthermore, it is possible for the present junction box to simplify a coupling/decoupling structure of connectors and sockets, reduce an installation space of the coupling/decoupling structure, and reduce a space loss.

Furthermore, it is possible for the present junction box to increase an installation space of terminals and circuit components, and enable an electric circuit to be readily formed.

Furthermore, it is possible for the present junction box to realize size reduction and slimming and to be installed in a narrow space.

Furthermore, it is possible for the present junction box to enable connectors and sockets to be coupled and decoupled through a bolting unit, enable the connectors and the sockets to be coupled and decoupled within a narrow space, and enjoy superior maintainability.

Furthermore, it is possible for the present junction box to enable sockets of a main body to be coupled to and decoupled from connectors of a lower cover through the accurate movement of the sockets.

Furthermore, it is possible for the present junction box to improve the coupling accuracy of sockets and connectors, and prevent inaccurate coupling of the sockets and the connectors.

Furthermore, it is possible for the present junction box to enable connectors and sockets to be coupled and decoupled with no severe frictional contact between components.

Furthermore, it is possible for the present junction box to reduce wear of components attributable to frictional contact between components and prevent reduction of assembly accuracy of components.

Furthermore, it is possible for the present junction box to prevent reduction of a coupling ability of connectors and sockets.

Furthermore, it is possible for the present junction box to enable sockets to be coupled to and decoupled from connectors while making up/down movement, and eliminate a need to adjust the length of wire harnesses of connectors.

Furthermore, it is possible for the present junction box to shorten the length of wire harnesses and consequently save a cost.

BRIEF DESCRIPTION OF THE DRAWINGS

The above and other objects and features of the present invention will become apparent from the following description of preferred embodiments given in conjunction with the accompanying drawings.

DETAILED DESCRIPTION OF PREFERRED EMBODIMENTS

Figure 1:
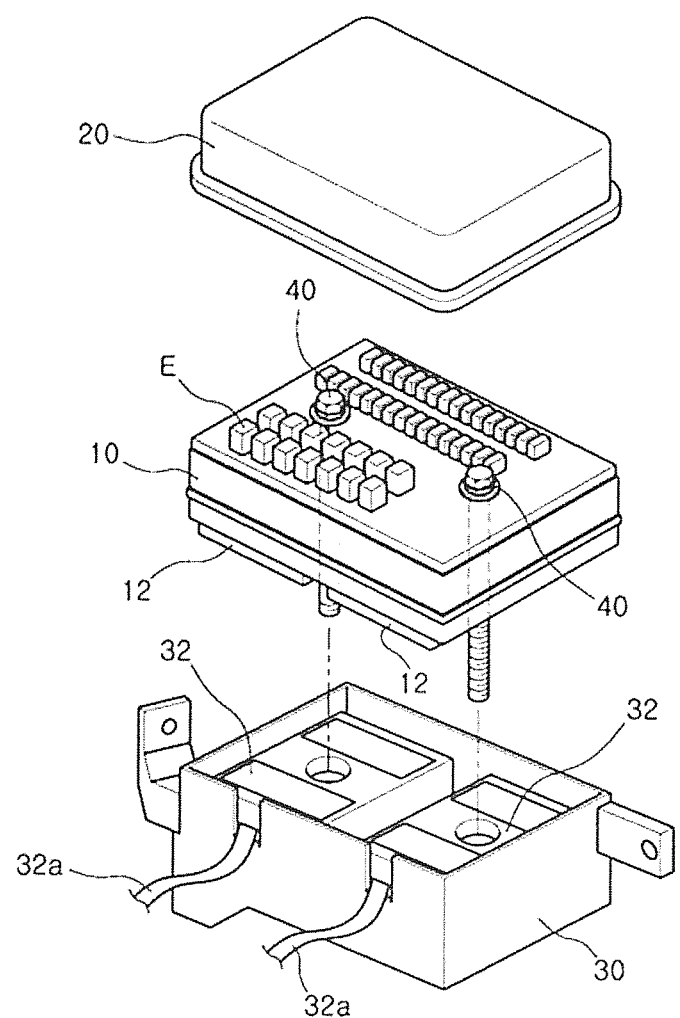
FIG. 1 is an exploded perspective view illustrating a conventional junction box.
Figure 2:
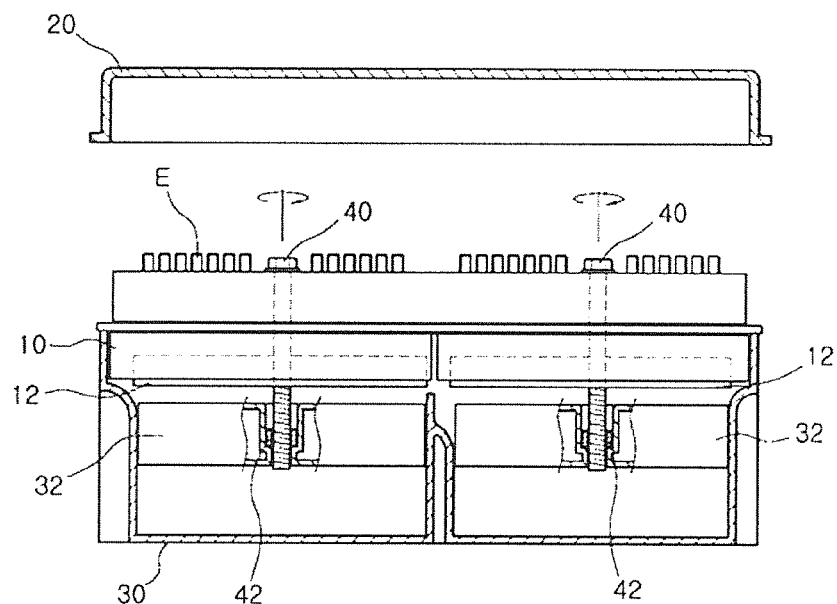
FIG. 2 is a sectional view of the junction box illustrated in FIG. 1.
Figure 3:
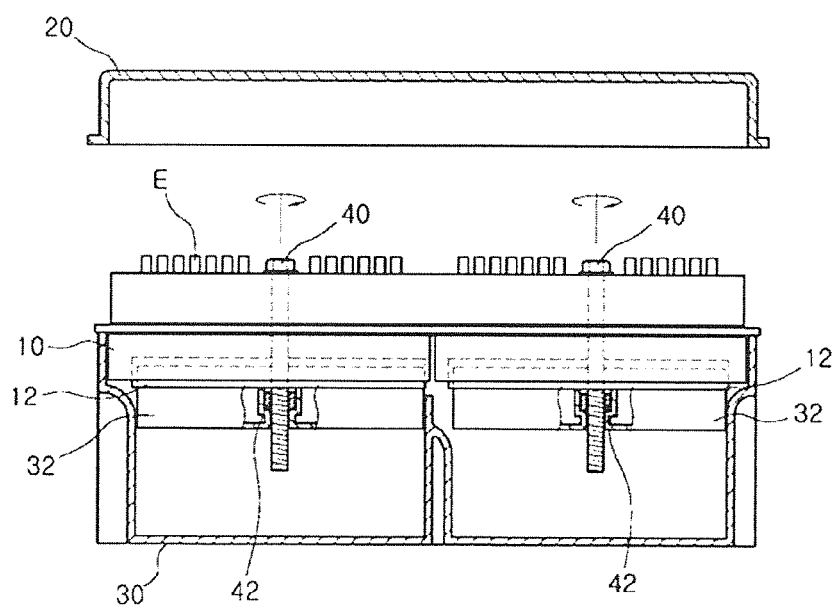
FIG. 3 is a sectional view illustrating an operation example of the junction box illustrated in FIG. 2.
Figure 4:
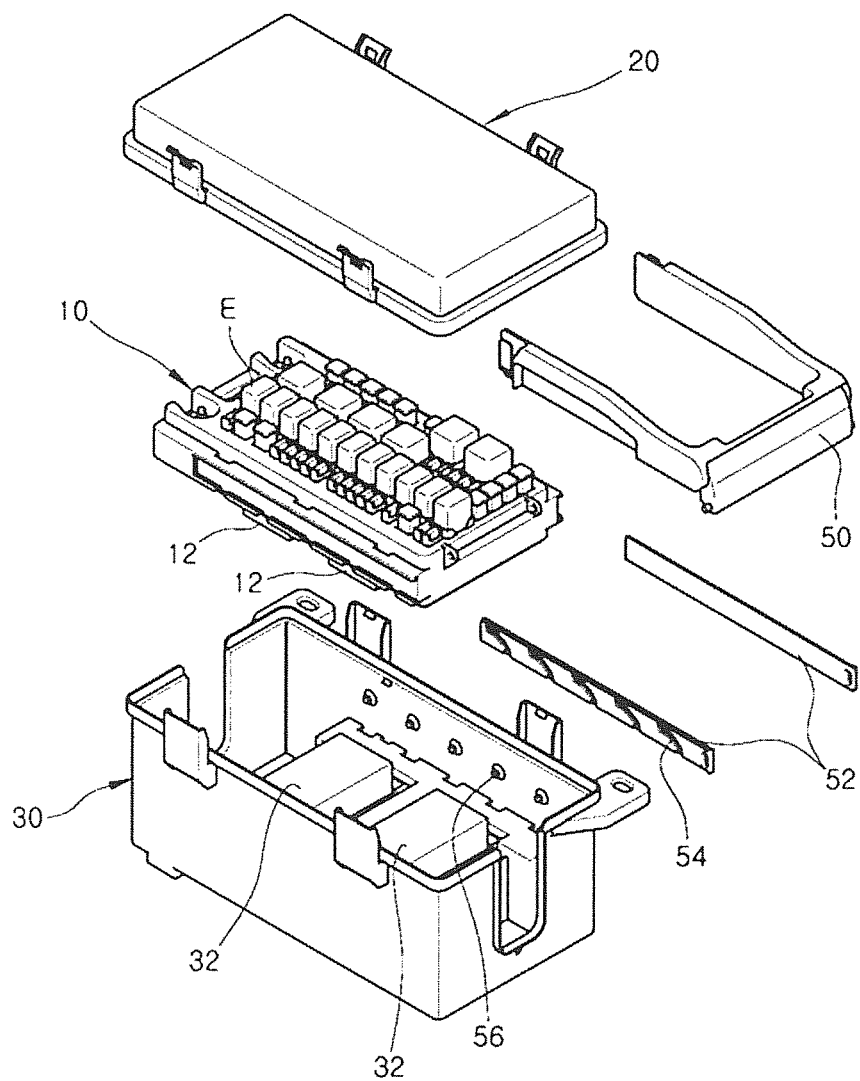
FIG. 4 is an exploded perspective view illustrating another conventional junction box.

A preferred embodiment of a junction box according to the present invention will now be described in detail with reference to the accompanying drawings (the same components as those of the prior art example described earlier will be designated by identical reference numerals).

Prior to describing features of the junction box according to the present invention, the outline of the junction box will be briefly described.

The junction box includes a main body 10 in which a plurality of circuit components E is installed. Sockets 12 are installed on the lower surface of the main body 10 and an upper cover 20 is assembled to the upper surface of the main body 10. The upper cover 20 covers the upper portion of the main body 10 to protect the circuit components E of the main body 10.

The junction box further includes a lower cover 30 that covers the lower portion of the main body 10. Connectors 32 are installed within the lower cover 30.

The connectors 32 are provided in a corresponding relationship with the sockets 12 and can be connected to the sockets 12. The connectors 32 configured as above transmit electric signals of the circuit components E, which are received from the sockets 12, to respective electric devices via wire harnesses 32a.

Next, some features of the junction box according to the present invention will be described with reference to FIGS. 1 to 12.

The junction box according to the present invention includes connector installation groove portions 34 formed in the lower cover 30. The connectors 32 are installed in the connector installation groove portions 34. The connector installation groove portions 34 are defined by connector support portions 34a.

The connector support portions 34a are formed in the form of ribs within the lower cover 30 and are configured to support the flange portions of the connectors 32.

The connector installation groove portions 34 includes connector fixing hooks 34b which are installed in pairs in the opposite sidewalls of the connector installation groove portions 34. The connector fixing hooks 34b are configured to lock and fix the flange portions of the connectors 32 supported by the connector support portions 34a. That is to say, the connector fixing hooks 34b serve to fix the connectors 32 to the lower cover 30. Thus, the connectors 32 fixed to the lower cover 30 can be connected to the sockets 12 of the main body 10.

Referring again to FIGS. 5 to 12, the junction box according to the present invention includes a coupling bolt 60 installed in the main body 10 and a coupling nut 70 installed in the lower cover 30 in a corresponding relationship with the coupling bolt 60.

The coupling bolt 60 includes a head portion 62 and a body portion 64. The head portion 62 is rotatably supported on the upper surface of the main body 10. The body portion 64 passes through the main body 10 and extends toward the coupling nut 70 of the lower cover 30.

In this regard, it is preferred that the coupling bolt 60 is installed in the central portion of the main body 10. This is to make sure that when threadedly coupling the coupling bolt 60 to the coupling nut 70 of the lower cover 30, the tightening force of the coupling bolt 60 acts on the central portion of the main body 10. Thus, the tightening force of the coupling bolt 60 is uniformly transferred from the central portion of the main body 10 to the periphery thereof in a balanced manner.

Figure 5:
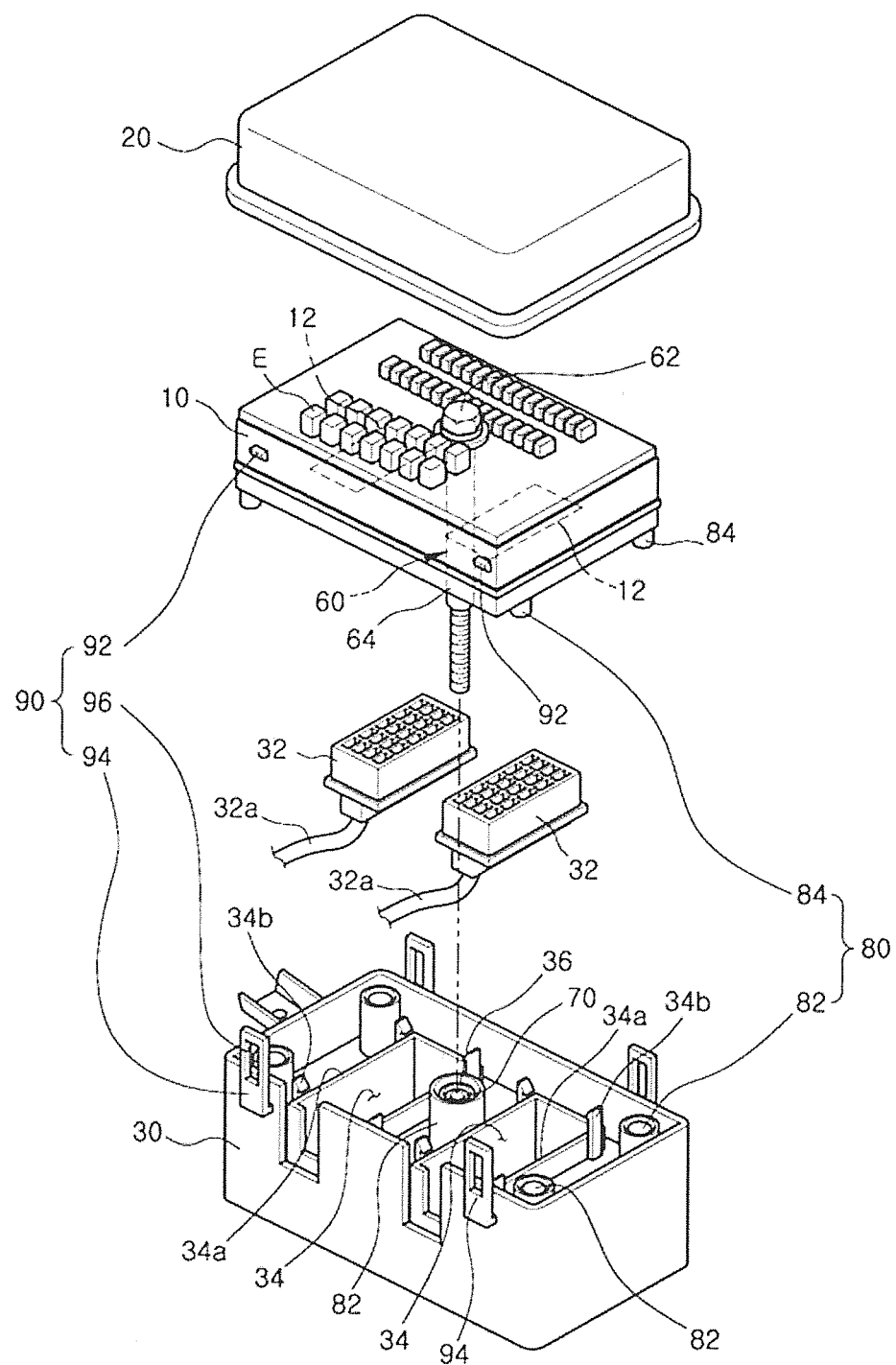
FIG. 5 is an exploded perspective view illustrating a junction box according to the present invention.
Figure 10:
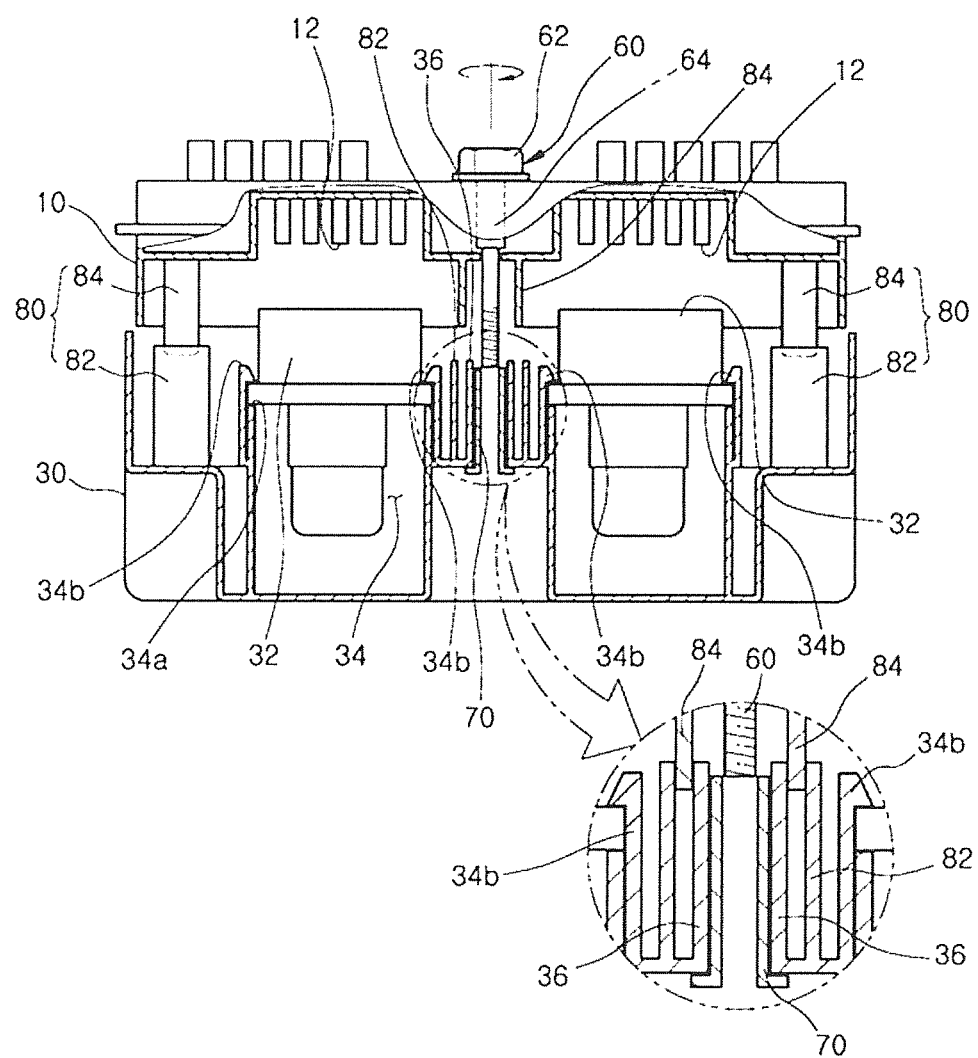
FIG. 10 is a sectional view taken along line X-X in FIG. 7, illustrating the lower cover provisionally assembled to the main body.
Figure 11:
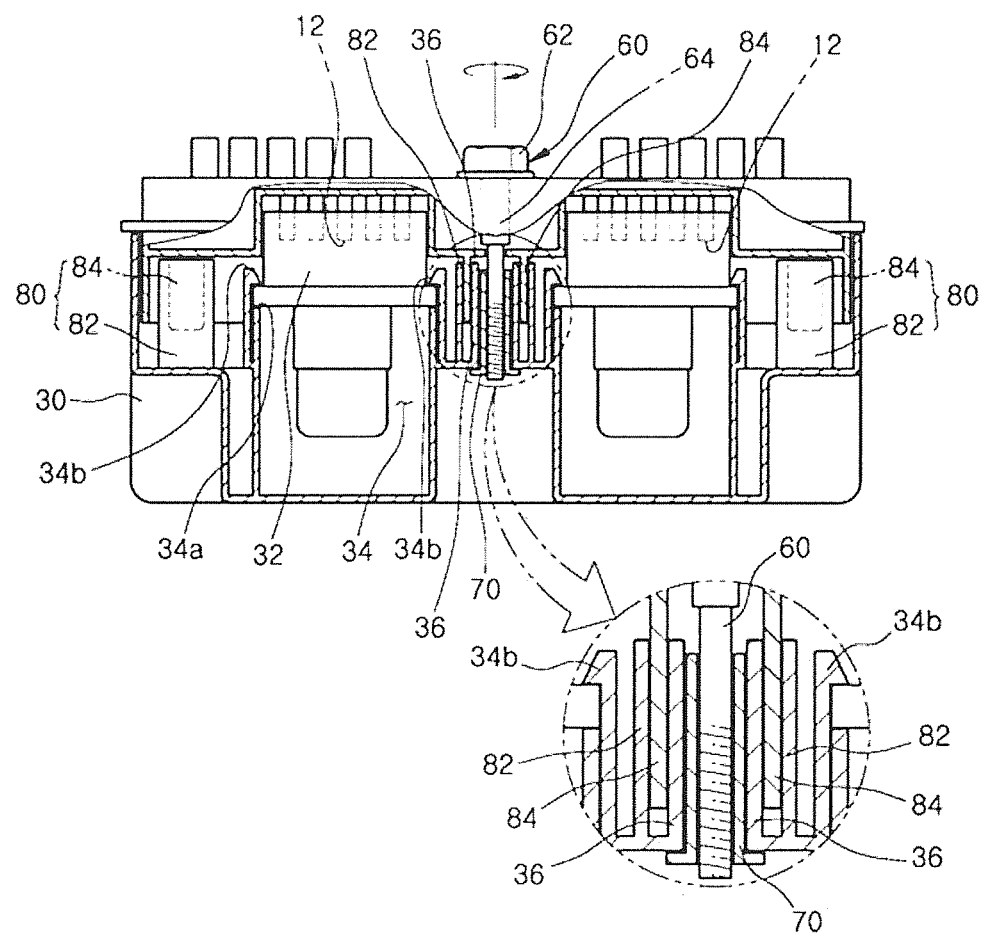
FIG. 11 is a sectional view taken along line XI-XI in FIG. 8, illustrating the lower cover finally assembled to the main body so that the sockets of the main body and the connectors of the lower cover are connected to each other.

As illustrated in FIGS. 5, 10 and 11, the coupling nut 70 is fixedly secured to the interior of a vertical pipe 36 disposed in the central portion of the lower cover 30. The coupling nut 70 is threadedly coupled with the coupling bolt 60 of the main body 10.

Since the coupling nut 70 fixed to the lower cover 30 is threadedly coupled with the coupling bolt 60 of the main body 10, the coupling bolt 60 can make screw motion in the up-down direction along the coupling nut 70.

Accordingly, the main body 10 can make up/down movement together with the coupling bolt 60. Thus, the sockets 12 installed on the lower surface of the main body 10 can be moved up and down and can be coupled to and decoupled from the connectors 32 of the lower cover 30.

Consequently, when the coupling bolt 60 is rotated by a worker, the coupling bolt 60 and the coupling nut 70 cooperate to move the main body 10 up and down. Thus, the sockets 12 of the main body 10 are moved up and down and are coupled to and decoupled from the connectors 32 of the lower cover 30.

In this regard, it is preferred that when injection-molding the lower cover 30, the coupling nut 70 is insert-molded with the lower cover 30. Alternatively, the coupling nut 70 may be fixed to the interior of the vertical tube 36 by, for example, caulking.

The coupling nut 70 is fixedly secured to the lower cover 30 and is disposed between the connector installation groove portions 34. Thus, the coupling nut 70 does not interfere with the connectors 32.

Unlike the prior art examples (see FIGS. 1 and 2) in which the coupling nuts are directly installed in the connectors 32, a loss of terminal installation area does not occur in the present junction box. This is advantageous in forming an electric circuit.

Furthermore, it is preferred that the coupling nut 70 is fixedly secured to the lower cover 30 in the central portion of the lower cover 30. Particularly, it is preferred that the coupling nut 70 is disposed between the connector installation groove portions 34.

The reason for employing this configuration is to make sure that when tightening the coupling bolt 60, the tightening force of the coupling bolt 60 acts on the central portion of the lower cover 30, particularly on the central portion between the connector installation groove portions 34.

Thus, the tightening force of the coupling bolt 60 is uniformly transferred in a balanced manner to the respective connectors 32 installed in the connector installation groove portions 34. As a result, the coupling forces of the sockets 12 of the main body 10 to the connectors 32 of the lower cover 30 are balanced. Consequently, the connectors 32 of the lower cover 30 and the sockets 12 of the main body 10 are smoothly coupled to each other without generating poor coupling.

Referring again to FIGS. 5 to 12, the junction box according to the present invention further includes guide units 80 for guiding the up/down movement of the main body 10 and the upper cover 20 with respect to the lower cover 30.

Each of the guide units 80 includes a guide pipe 82 vertically installed on the lower cover 30 and a guide rod 84 installed in the main body 10 and movably fitted to the guide pipe 82.

The guide pipes 82 of the guide units 80 are vertically installed at four corners of the lower cover 30. The guide pipes 82 thus installed accommodate the guide rods 84 of the main body 10 and guide the up/down movement of the guide rods 84.

The guide rods 84 extend from the lower surface of the main body 10 toward the respective guide pipes 82 of the lower cover 30. When assembling the main body 10 and the lower cover 30 together, the guide rods 84 are accommodated within the guide pipes 82 of the lower cover 30. The guide rods 84 accommodated in the guide pipes 82 of the lower cover 30 guide the up/down movement of main body 10 with respect to the lower cover 30. In particular, when the main body 10 is moved down or up in response to the tightening or loosening of the coupling bolt 60, the guide rods 84 serve to guide the downward/upward movement of the main body 10.

This enables the main body 10 to make smooth up/down movement with no looseness. Thus, the sockets 12 installed in the main body 10 can be moved down and up while maintaining an accurate posture. This makes it possible to significantly improve the coupling ability of the sockets 12 of the main body 10 with respect to the connectors 32 of the lower cover 30.

Consequently, the guide pipes 82 and the guide rods 84 of the guide units 80 guide the up/down movement of the main body 10 with respect to the lower cover 30 so that the main body 10 can be uniformly moved up and down in a balanced manner. This enables the sockets 12 of the main body 10 to move up and down while maintaining a specified posture. As a result, the sockets 12 of the main body 10 can be accurately coupled to the connectors 32 of the lower cover 30 with no poor coupling.

As illustrated in FIGS. 5, 10 and 11, one of the guide pipes 82 of the guide units 80 is installed around the coupling nut 70 of the coupling nut 70. More specifically, one of the guide pipes 82 is installed around the vertical pipe 36, to which the coupling nut 70 is fixed, in a spaced-apart relationship with the vertical pipe 36.

One of the guide rods 84 is installed on the lower surface of the main body 10 in a corresponding relationship with one of the guide pipes 82 installed around the vertical pipe 36.

One of the guide rods 84 is formed in a hollow pipe shape and is installed around the coupling bolt 60. One of the guide rods 84 thus installed is fitted to the corresponding guide pipe 82. Specifically, one of the guide rods 84 thus installed is fitted to between the vertical pipe 36 of the lower cover 30 and one of the guide pipes 82.

When assembling the lower cover 30 and the main body 10, one of the guide rods 84 installed around the coupling bolt 60 and one of the guide pipes 82 installed around the coupling nut 70 are coupled to each other, thereby guiding the up/down movement of the main body 10.

This makes it possible to improve the assembling accuracy of the lower cover 30 and the main body 10 and the coupling accuracy of the connectors 32 of the lower cover 30 and the sockets 12 of the main body 10.

It is preferred that the guide pipes 32 and the guide rods 84 of the guide units 80 configured as above are injection-molded with the main body 10 and the lower cover 30, respectively.

While the guide pipes 82 and the guide rods 84 of the guide units 80 are formed to have a circular cross-sectional shape in the illustrated embodiment, they may be formed to have a polygonal shape, for example, a pentagonal shape.

Referring again to FIGS. 5 to 12, the junction box according to the present invention further includes a provisional assembling unit 90 which serves to provisionally assemble the lower cover 30 with the main body 10.

The provisional assembling unit 90 includes a plurality of provisional assembling projections 92 formed on opposite lateral surfaces of the main body 10 and a plurality of provisional assembling brackets 94 formed in the lower cover 30 so as to be provisionally assembled with the provisional assembling projections 92.

The provisional assembling projections 92 are formed in pairs so as to protrude from the opposite lateral surfaces of the main body 10. It is preferred that two pairs of provisional assembling projections 92 are respectively formed on the opposite lateral surfaces of the main body 10.

The provisional assembling brackets 94 correspond to the provisional assembling projections 92 and extend from the opposite sidewalls of the lower cover 30 toward the provisional assembling projections 92 of the main body 10.

The provisional assembling brackets 94 include provisional assembling slots 96 which extend in the up-down direction along the provisional assembling brackets 94. The provisional assembling projections 92 of the main body 10 are fitted to the provisional assembling slots 96.

If the provisional assembling projections 92 are fitted to the provisional assembling brackets 94, the lower cover 30 having the provisional assembling brackets 94 are provisionally assembled with the main body 10 having the provisional assembling projections 92.

Since the provisional assembling slots 96 of the provisional assembling brackets 94 extend in the up-down direction, the main body 10 is allowed to move up and down with respect to the lower cover 30.

If the coupling bolt 60 is rotated and tightened in the forward direction with the lower cover 30 provisionally assembled with the main body 10, the main body 10 is moved down toward the lower cover 30. Thus, the main body 10 and the lower cover 30 can be finally assembled together.

Conversely, if the coupling bolt 60 is rotated and loosened in the reverse direction with the lower cover 30 finally assembled with the main body 10, the main body 10 is moved up away from the lower cover 30. Thus, the main body 10 and the lower cover 30 can be returned to a provisionally-assembled state.

Next, an operation example of the present junction box having the aforementioned configuration will be described with reference to FIGS. 5 to 12.

First, descriptions will be made on a process of assembling the main body 10, the lower cover 30 and the upper cover 20 together.

Figure 6:
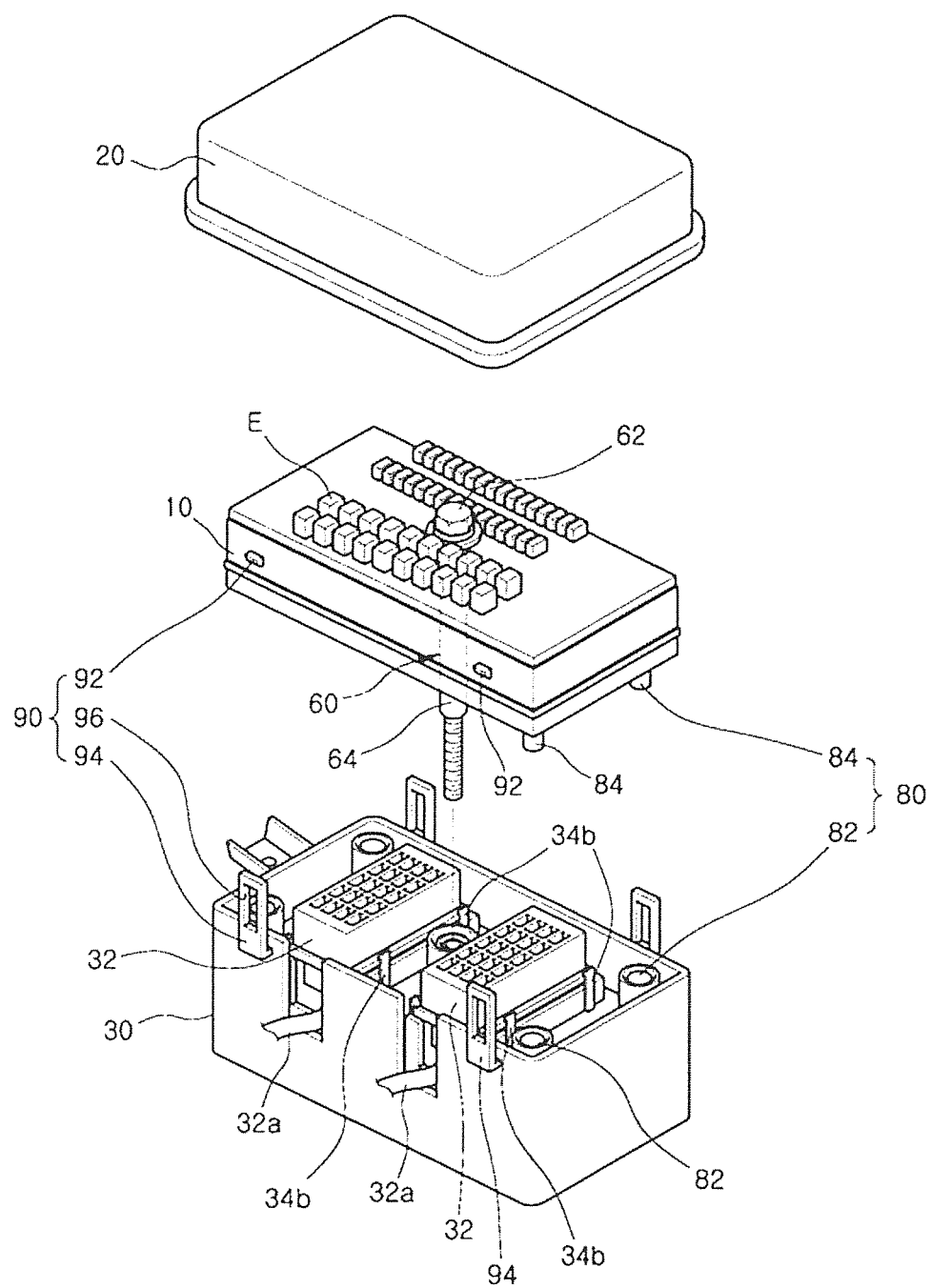
FIG. 6 is a perspective view of the junction box according to the present invention with the connecters fitted to the lower cover.

Referring to FIGS. 5 and 6, the coupling bolt 60 is installed in the main body 10. The connectors 32 are fixedly secured to the lower cover 30.

Figure 7:
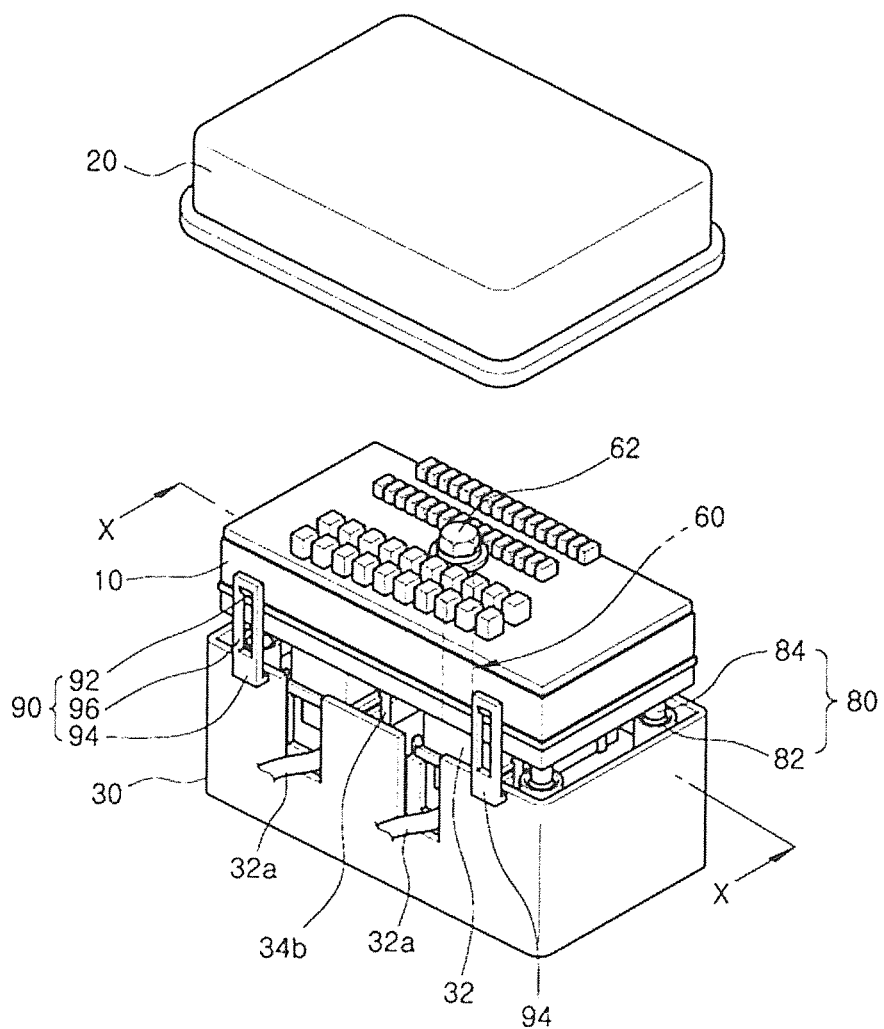
FIG. 7 is a perspective view of the junction box according to the present invention with the lower cover provisionally assembled to the main body.
Figure 8:
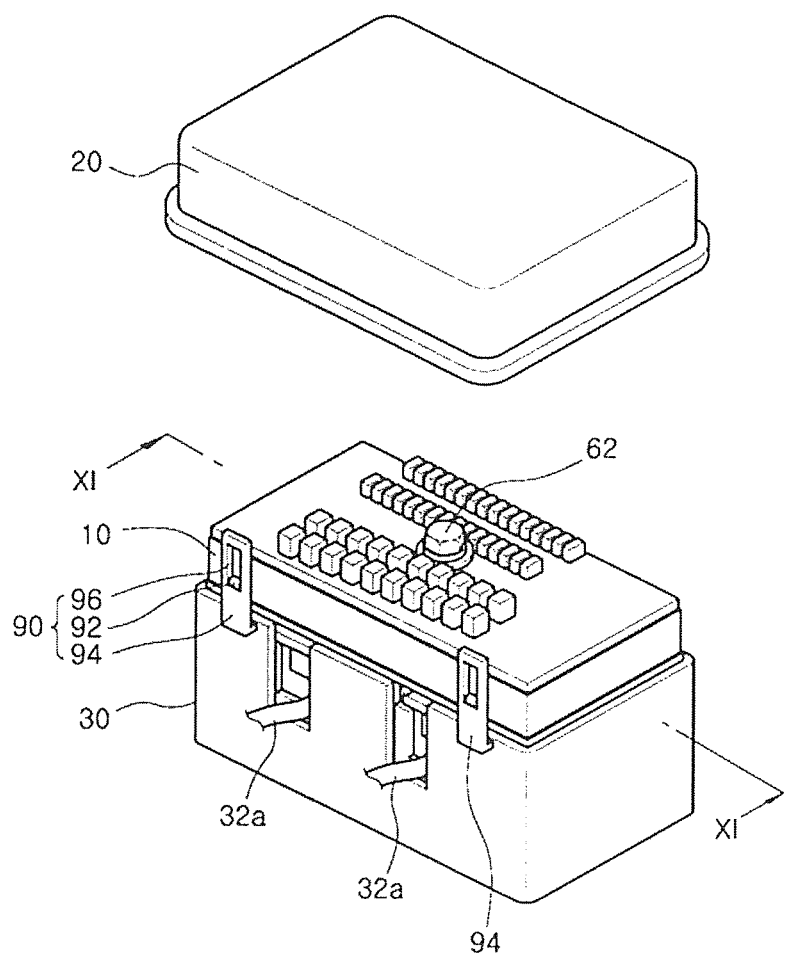
FIG. 8 is a perspective view of the junction box according to the present invention with the lower cover finally assembled to the main body.

Then, the lower cover 30 is disposed below the main body 10. Thereafter, as illustrated in FIGS. 7 and 10, the provisional assembling brackets 94 of the lower cover 30 are fitted to the provisional assembling projections 92 of the main body 10. As a result, the lower cover 30 is provisionally assembled with the main body 10.

If the coupling bolt 60 of the main body 10 is rotated and tightened in the forward direction in this state, the coupling bolt 60 is moved down along the coupling nut 70 of the lower cover 30 while making screw motion, as illustrated in FIGS. 7 to 11.

As the coupling bolt 60 is threadedly moved along the coupling nut 70 of the lower cover 30, the main body 10 is moved downward. As a result, the sockets 12 of the main body 10 are also moved downward and are coupled to the connectors 32 of the lower cover 30.

At this time, the downward movement of the main body 10 is guided by the guide pipes 82 and the guide rods 84 of the guide units 80. Thus, the sockets 12 of the main body 10 are moved down in a specified posture with no shaking and are accurately coupled to the connectors 32 of the lower cover 30.

If the sockets 12 of the main body 10 are coupled to the connectors 32 of the lower cover 30, the main body 10 and the lower cover 30 come into a completely-assembled state.

Figure 9:
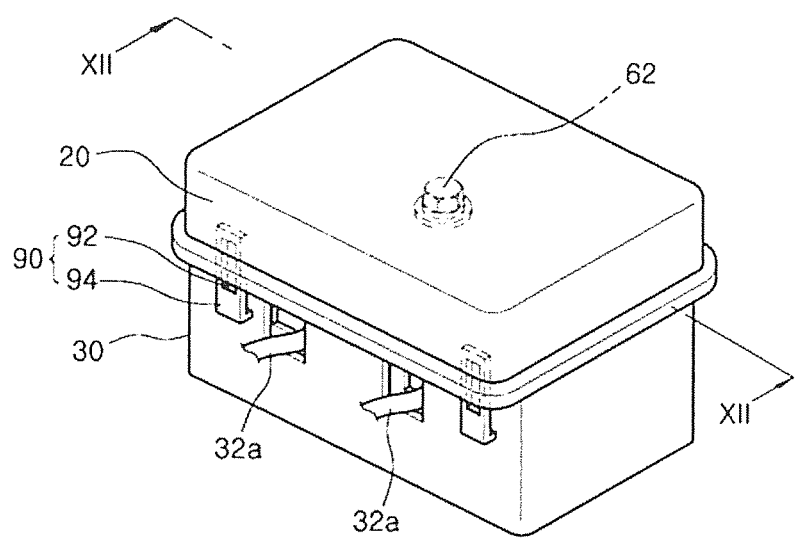
FIG. 9 is a perspective view of the junction box according to the present invention with the upper cover assembled to the main body.
Figure 12:
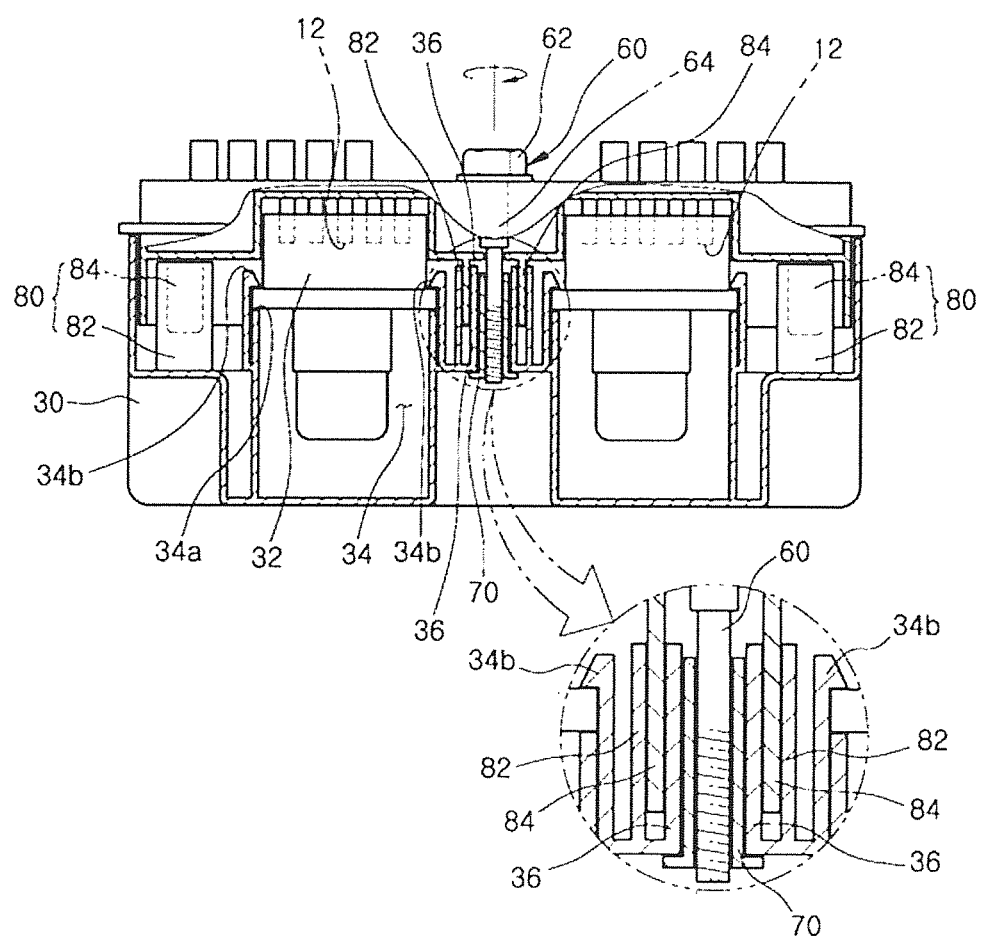
FIG. 12 is a sectional view taken along line XII-XII in FIG. 9, illustrating the upper cover assembled to the main body.

After the main body 10 and the lower cover 30 are assembled together, the upper cover 20 is finally assembled with the main body 10 as illustrated in FIGS. 9 and 12. As a result, the main body 10, the lower cover 30 and the upper cover 20 are completely assembled into one piece.

Next, descriptions will be made on a process of disassembling the main body 10, the lower cover 30 and the upper cover 20.

First, the upper cover 20 is disassembled from the main body 10 as illustrated in FIGS. 7 to 12. Then, if the coupling bolt 60 of the main body 10 is rotated and loosened in the reverse direction, the coupling bolt 60 is moved upward along the coupling nut 70 while making screw motion.

As the coupling bolt 60 is moved upward along the coupling nut 70 of the lower cover 30, the main body 10 is moved upward. As a result, the sockets 12 of the main body 10 are also moved upward and are decoupled from the connectors 32 of the lower cover 30.

In this state, as illustrated in FIGS 6 and 7, the provisional assembling brackets 94 of the lower cover 30 are removed from the provisional assembling projections 92 of the main body 10.

Thus, the lower cover 30 provisionally assembled with the main body 10 comes into a separable state. If the lower cover 30 is separated from the main body 10 in this state, the main body 10, the lower cover 30 and the upper cover 20 are completely separated from one another.

According to the present junction box configured as above, it is possible to enable the connectors 32 and the sockets 12 to be coupled and decoupled through the use of a single bolting unit, reduce the number of components and consequently reduce the manufacturing cost.

Furthermore, it is possible for the present junction box to enable the connectors 32 and the sockets 12 to be coupled and decoupled at one time through a simple operation and make it easy and convenient to couple and decouple the connectors 32 and the sockets 12.

Furthermore, it is possible for the present junction box to enable the connectors 32 and the sockets 12 to be rapidly coupled and decoupled within a short period of time and increase the work efficiency.

Furthermore, it is possible for the present junction box to simplify a coupling/decoupling structure of the connectors 32 and the sockets 12, reduce an installation space of the coupling/decoupling structure, and reduce a space loss.

Furthermore, it is possible for the present junction box to increase an installation space of terminals and circuit components, and enable an electric circuit to be readily formed.

Furthermore, it is possible for the present junction box to realize size reduction and slimming and to be installed in a narrow space.

Furthermore, it is possible for the present junction box to enable the connectors 32 and the sockets 12 to be coupled and decoupled through the bolting unit, enable the connectors 32 and the sockets 12 to be coupled and decoupled within a narrow space, and enjoy superior maintainability.

Furthermore, it is possible for the present junction box to enable the sockets 12 of the main body 10 to be coupled to and decoupled from the connectors 32 of the lower cover 30 through the accurate movement of the sockets 12.

Furthermore, it is possible for the present junction box to improve the coupling accuracy of the sockets 12 and the connectors 32, and prevent inaccurate coupling of the sockets 12 and the connectors 32.

Furthermore, it is possible for the present junction box to enable the connectors 32 and the sockets 12 to be coupled and decoupled with no severe frictional contact between components.

Furthermore, it is possible for the present junction box to reduce wear of components attributable to frictional contact between components and prevent reduction of assembly accuracy of components.

Furthermore, it is possible for the present junction box to prevent reduction of a coupling ability of the connectors 32 and the sockets 12.

Furthermore, it is possible for the present junction box to enable the sockets 12 to be coupled to and decoupled from the connectors 32 while making up/down movement, and eliminate a need to adjust the length of the wire harnesses 32*a* of the connectors 32.

Furthermore, it is possible for the present junction box to shorten the length of the wire harnesses 32*a* and consequently save a cost.

While a preferred embodiment of the present invention have been described above, the present invention is not limited to this embodiment. It is to be understood that various changes and modifications may be made without departing from the scope of the invention defined in the claims.

What is claimed is:

1. A junction box, comprising:
a main body in which circuit components are installed;
a lower cover configured to cover a lower portion of the main body;
one or more sockets installed on a lower surface of the main body;
one or more connectors installed in the lower cover and configured to be coupled to the sockets;
a single coupling bolt installed in the main body; and
a single coupling nut installed in the lower cover and threadedly coupled to the coupling bolt,
wherein when rotationally operating the single coupling bolt, the main body is configured to move up or down with respect to the lower cover so that the sockets are coupled to or decoupled from the connectors while making up/down movement with respect to the connectors.

2. The junction box of claim 1, further comprising:
a fixing unit configured to fix the connectors to the lower cover, the fixing unit including connector installation groove portions installed inside the lower cover so as to accommodate the connectors and connector fixing hooks installed in pairs in opposite sidewalls of the connector installation groove portions so as to lock and fix the connectors installed in the connector installation groove portions.

3. The junction box of claim 1, wherein when tightening or loosening the coupling bolt, the coupling nut is configured to cause the coupling bolt to move up or down so that the sockets are moved toward or away from the connectors.

4. The junction box of claim 3, wherein when rotating the coupling bolt in a forward direction, the main body is configured to move down toward the lower cover so that the main body and the lower cover are assembled with each other and so that the sockets and the connectors are coupled to each other, and when rotating the coupling bolt in a reverse direction, the main body is configured to move up away from the lower cover so that the main body and the lower cover are disassembled from each other and so that the sockets and the connectors are decoupled from each other.

5. The junction box of claim 4, further comprising:
a provisional assembling unit configured to provisionally assemble the lower cover with the main body prior to tightening the coupling bolt, the provisional assembling unit including a plurality of provisional assembling brackets having provisional assembling slots and extending from the lower cover toward the main body and a plurality of provisional assembling projections formed in the main body and configured to be fitted to the provisional assembling slots of the provisional assembling brackets,
wherein the lower cover is configured to be provisionally assembled with the main body when the provisional assembling projections are fitted to the provisional assembling slots of the provisional assembling brackets, and the provisional assembling slots of the provisional assembling brackets are formed so as to allow up/down movement of the main body with respect to the lower cover when the coupling bolt is tightened or loosened.

6. The junction box of claim 1, further comprising:
a guide unit configured to guide up/down movement of the main body with respect to the lower cover, the guide unit including a plurality of guide rods extending from the main body toward the lower cover and a plurality of guide pipes configured to accommodate the guide rods and installed in the lower cover so as to guide up/down movement of the guide rods.

7. The junction box of claim 6, wherein the guide rods and the guide pipes are injection-molded with the main body and the lower cover, respectively.

8. The junction box of claim 7, wherein the guide rods and the guide pipes are formed to have a circular cross-sectional shape.

9. The junction box of claim 1, wherein the coupling bolt is installed in a central portion of the main body and the coupling nut is installed in a central portion of the lower cover so that a tightening force of the coupling bolt is uniformly transferred from the central portions of the main body and the lower cover toward peripheral portions thereof in a balanced manner.

10. The junction box of claim 9, wherein the coupling nut is fixedly secured to the central portion of the lower cover so as not to interfere with the connectors.

11. The junction box of claim 10, wherein the coupling nut is fixed to the lower cover by inset-molding or caulking.

* * * * *